United States Patent [19]

Matsuta

[11] Patent Number: 4,633,188
[45] Date of Patent: Dec. 30, 1986

[54] MIXER/AMPLIFIER CIRCUIT
[75] Inventor: Shigetoshi Matsuta, Soma, Japan
[73] Assignee: Alps Electric Co., Ltd., Japan
[21] Appl. No.: 800,054
[22] Filed: Nov. 20, 1985
[30] Foreign Application Priority Data
 Nov. 21, 1984 [JP] Japan .................... 59-246847
[51] Int. Cl.⁴ ............................... H03F 3/19
[52] U.S. Cl. ..................... 330/51; 330/147;
                        455/144; 455/188; 455/333
[58] Field of Search ............ 330/51, 147, 295, 306,
         330/305; 455/144, 143, 188, 190, 341, 333;
                                    358/191.1; 334/47

[56] References Cited
U.S. PATENT DOCUMENTS

| 3,482,178 | 12/1969 | Habian | 455/188 X |
| 3,694,756 | 9/1972 | Carlson | 325/451 |
| 3,727,140 | 4/1973 | Nieto et al. | 334/47 X |
| 3,949,306 | 4/1976 | Watanabe et al. | 330/307 X |
| 4,160,953 | 7/1979 | Matsuura et al. | 331/58 X |

FOREIGN PATENT DOCUMENTS 1115843  5/1968  United Kingdom ............. 455/190

Primary Examiner—James B. Mullins
Attorney, Agent, or Firm—Guy W. Shoup

[57] ABSTRACT

A mixer/amplifier circuit for selectively mixing a first input signal with a local oscillator signal or amplifying a second input signal. The mixer/amplifier circuit includes a transistor, a first circuit arrangement responsive to a first switching signal for enabling the transistor to operate as a grounded-base transistor to amplify the second input signal supplied to the emitter thereof, and a second circuit arrangement responsive to a second switching signal for enabling the transistor to operate as a grounded-emitter transistor to mix the first input signal supplied to the base thereof with the local oscillator.

3 Claims, 10 Drawing Figures

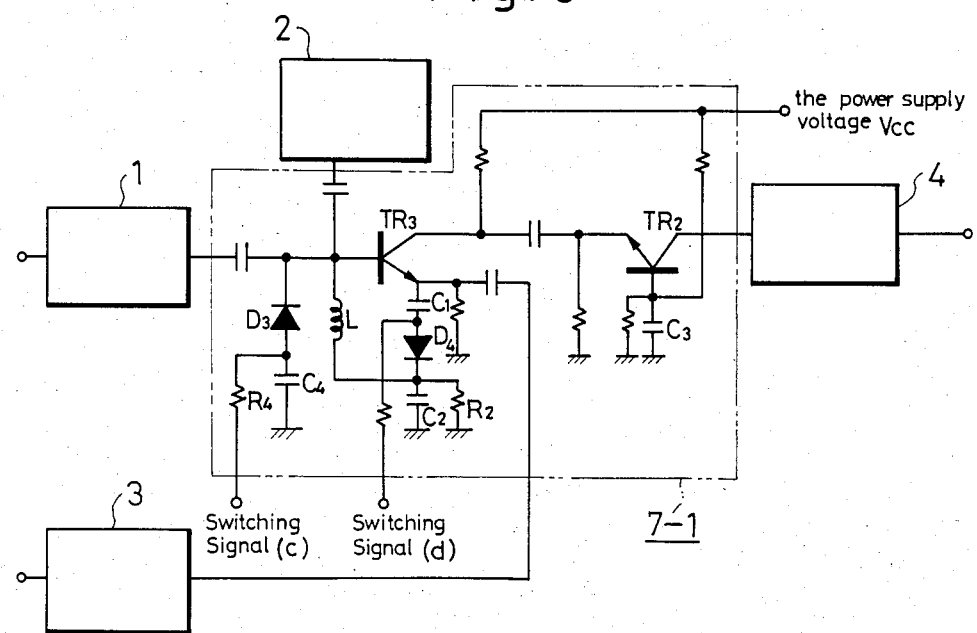
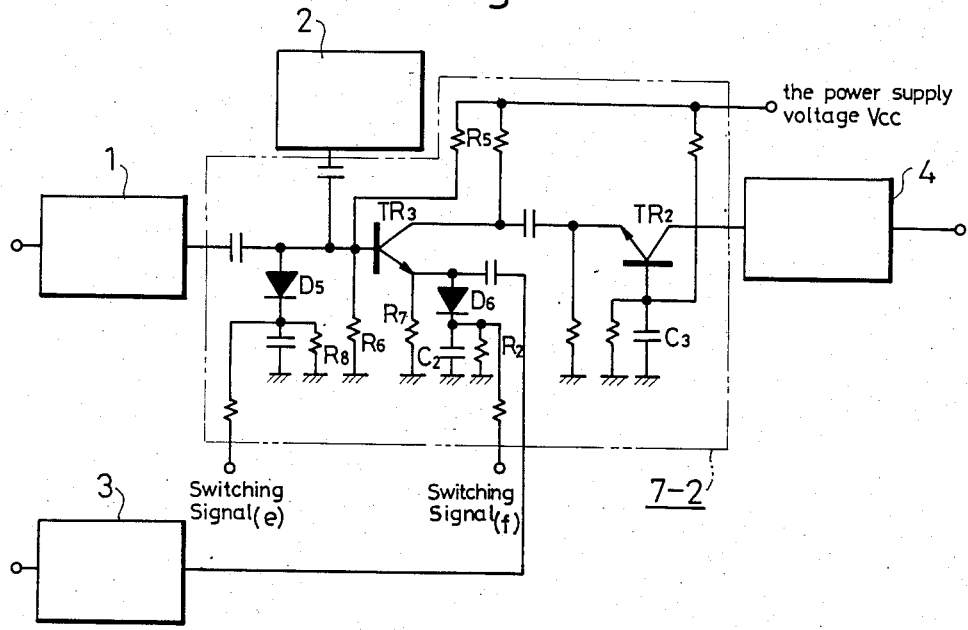

MIXER/AMPLIFIER CIRCUIT

BACKGROUND OF THE INVENTION

The present invention relates to a mixer/ amplifier circuit, and more particularly to a mixer/ amplifier circuit for selectively receiving signals in different frequency bands such as VHF and UHF bands, for example, and issuing the signals as the same intermediatefrequency signals substantially at the same level.

Mixer circuits employed in UHF tuner circuits are now constructed of transistors having amplifying capabilities. Signals in the UHF band are amplified at the same time that they are converted into IF signals by the UHF tuner circuit. Therefore, the converted and amplified signals from the UHF tuner circuit and signals received in the VHF band have widely different signal levels when they are selectively received. It has been customary to adjust the bias current for a transistor used as a mixer in the VHF tuner circuit, i.e., as an amplifier in the reception of UHF signals, for varying the amplification factor at the time of receiving signals in the VHF and UHF bands, thus obtaining signals at substantially the same level. To produce the signals at substantially the same level, however, the bias current for the mixer transistor has to be extremely small in the reception of UHF signals, resulting in an increased distortion. In order to keep the distortion below a certain limit, the bias current for the transistor cannot be reduced until the amplification factor is sufficiently lowered. Accordingly, high-level signals have to be issued for the UHF band.

A conventional mixer/amplifier circuit and a circuit arrangement employing such a mixer/amplifier circuit will be described with reference to FIGS. 9 and 10.

As shown in FIG. 10, when a VHF signal is received, a weak VHF signal received by an antenna is supplied to a mixer/amplifier circuit 5 through a VHF circuit 1 composed of a filter 1-1, a tuner 1-2, an RF amplifier 1-3, and a tuner 1-4. When a UHF signal is received, a weak UHF signal received by an antenna is converted into an IF signal by a UHF circuit 3 composed of a tuner 3-1, an RF amplifier 3-2, a tuner 3-3, a mixer 3-4, and an IF filter 3-6, and the IF signal issued from the UHF circuit 3 is supplied to the mixer/amplifier circuit 5. The mixer/amplifier circuit 5 operates in either a first mode to mix the supplied VHF signal with a signal from a VHF local oscillator 2 to produce an IF signal which is supplied to a next IF filter 4, or a second mode to amplify the IF signal converted from the UHF signal and supply the amplified signal to the next IF filter 4.

The mixer/amplifier circuit 5 is illustrated in greater detail in FIG. 9. The first or second mode is selected by applying a power supply voltage as a switching signal (a) or (b) to render a diode $D_1$ or $D_2$ conductive. When the UHF signal is received, the VHF local oscillator 2 is separated from the mixer/amplifier circuit 5. In the first mode, the VHF signal supplied from the VHF circuit 1 through the diode $D_1$ is mixed with the signal from the VHF local oscillator 2, and the mixed signal is applied to the base of a transistor $TR_1$ for frequency conversion. The signal from the transistor $TR_1$ is amplified by a transistor $TR_2$ which supplies the amplified signal to the IF filter 4. In the second mode, the IF signal supplied from the UHF circuit 3 through the diode $D_2$ is amplified by the transistors $TR_1$, $TR_2$, and the amplified signal is supplied to the IF filter 4. As is apparent from FIG. 10, the signal from the UHF circuit 3 is amplified by transistors of the mixer 3-4 in the UHF circuit 3. When matching the output levels of VHF and UHF signals, the foregoing distortion occurs.

As illustrated in FIG. 9, the diodes $D_1$, $D_2$ are inserted as switches in series with the signal sources for alternatively selecting the signals from the VHF circuit 1 and the UHF circuit 3. Since the diodes $D_1$, $D_2$ have some capacitances between their terminals even when they are not conductive or are reverse-biased, one of the signals tends to be mixed with the other signal while the latter is being received, resulting in signal reception interference, and the tuner 1-4 in the VHF circuit 1 and the IF filter 3-6 in the UHF circuit 3 serve as loads of each other.

SUMMARY OF THE INVENTION

It is an object of the present invention to provide a mixer/amplifier circuit for producing IF signals from signals of different levels in different frequency bands such as VHF and UHF bands, the mixer/amplifier circuit having means for compensating for the difference between the different signal levels.

Another object of the present invention is to provide a mixer/amplifier for producing IF signals from input signals in different frequency bands, the mixer/ amplifier including means for preventing the input signals from being mixed with each other and also preventing circuits for issuing the input signals from serving as loads of each other.

According to the present invention, there is provided a mixer/amplifier circuit for selectively mixing a first input signal with a local oscillator signal or amplifying a second input signal. The mixer/amplifier circuit includes a transistor, a first circuit arrangement responsive to a first switching signal for enabling the transistor to operate as a grounded-base transistor to amplify the second input signal supplied to the emitter thereof, and a second circuit arrangement responsive to a second switching signal for enabling the transistor to operate as a grounded-emitter transistor to mix the first input signal supplied to the base thereof with the local oscillator.

The above and other objects, features and advantages of the present invention will become more apparent from the following description when taken in conjunction with the accompanying drawings in which preferred embodiments of the present invention are shown by way of illustrative example.

BRIEF DESCRIPTION OF THE DRAWINGS

FIGS. 6 through 8 are circuit diagrams, partly in block form, showing mixer/amplifier circuits according to other embodiments of the present invention;

DESCRIPTION OF THE PREFERRED EMBODIMENTS

Designated in FIGS. 1 through 8 at 1 is a VHF circuit, 2 a VHF local oscillator, 3 a UHF circuit, 4 an IF filter, 6, 6-1 through 6-6, 7-1, 7-2, and 7-3 a mixer/amplifier circuit, TR$_2$ through TR$_4$ transistors, R$_1$ through R$_8$ resistors, D$_3$ through D$_8$ diodes, and C$_1$ through C$_8$ capacitors.

Figure 1:
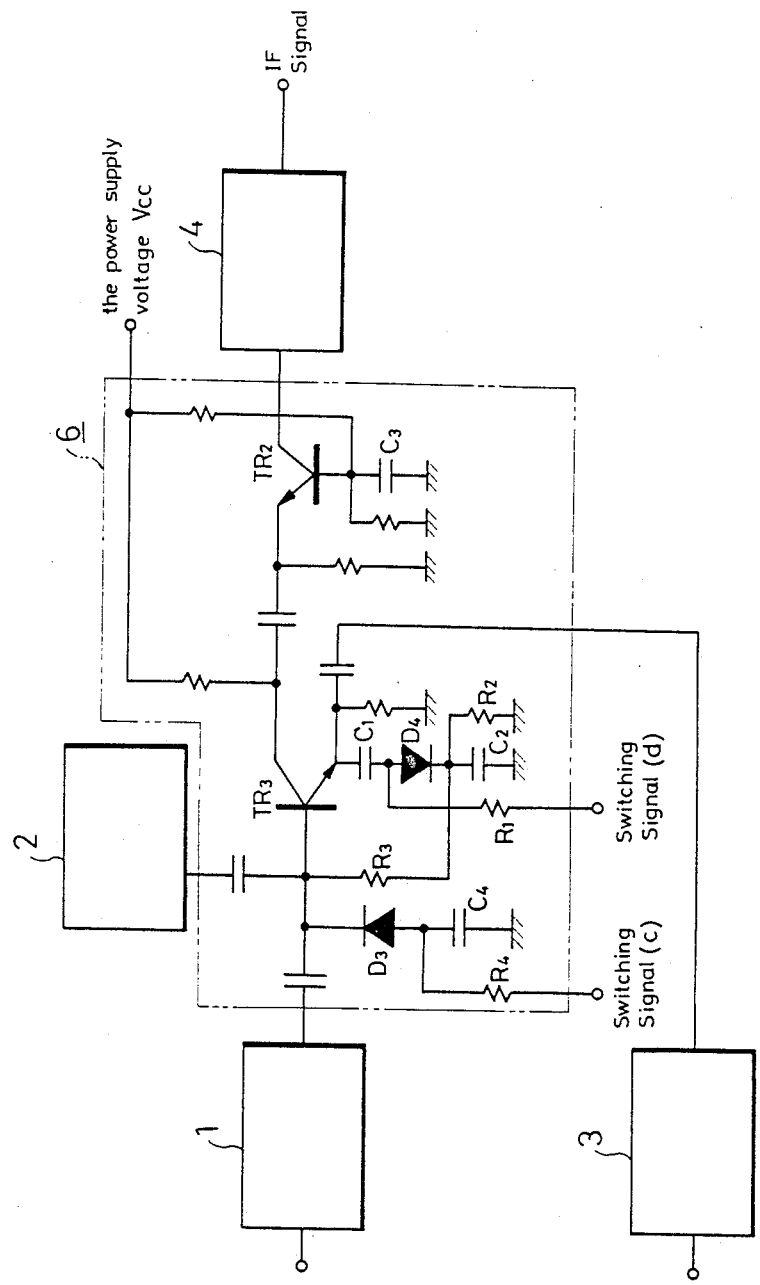
FIG. 1 is a circuit digram, partly in block form, showing a mixer/amplifier circuit according to an embodiment of the present invention.

As shown in FIG. 1, the mixer/amplifier circuit 6 according to the present invention operates by supplying a power supply voltage Vcc as a switching signal (c) or a switching signal (d) to ground the base or emitter of the transistor TR$_3$ for effecting signal amplification with a prescribed amplification factor or frequency conversion. The difference between power gains of the base-grounded or emitter-grounded arrangement can compensate for the difference between the levels of signals supplied from the UHF circuit 3 and the VHF circuit 1. By completely separating the input sections for receiving the supplied signals, signal reception interference can be prevented which would be caused by signal mixing, and elements of the VHF and UHF circuits 1, 3 can be prevented from serving as each other's loads.

The arrangement and operation of the mixer/amplifier of FIG. 1 will be described in greater detail with reference to FIGS. 2 through 5.

Figure 2:
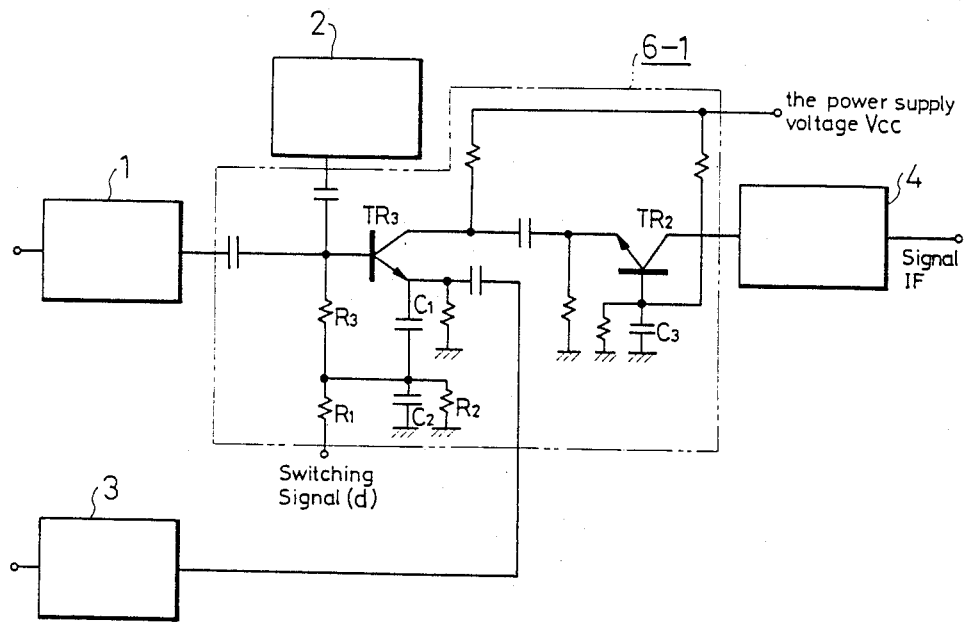
FIGS. 2 through 5 are circuit digrams, partly in block form, explanatory of operation of the mixer/amplifier shown in FIG. 1.

FIG. 2 shows a circuit arrangement employed when the power supply voltage Vcc is applied as the switching signal (d) for receiving a VHF signal. Since the the power supply voltage Vcc is only applied as the switching signal (d) and the switching signal (c) is of a zero voltage, the diode D$_3$ (FIG. 1) is rendered nonconductive and omitted from FIG. 2.

Figure 3:
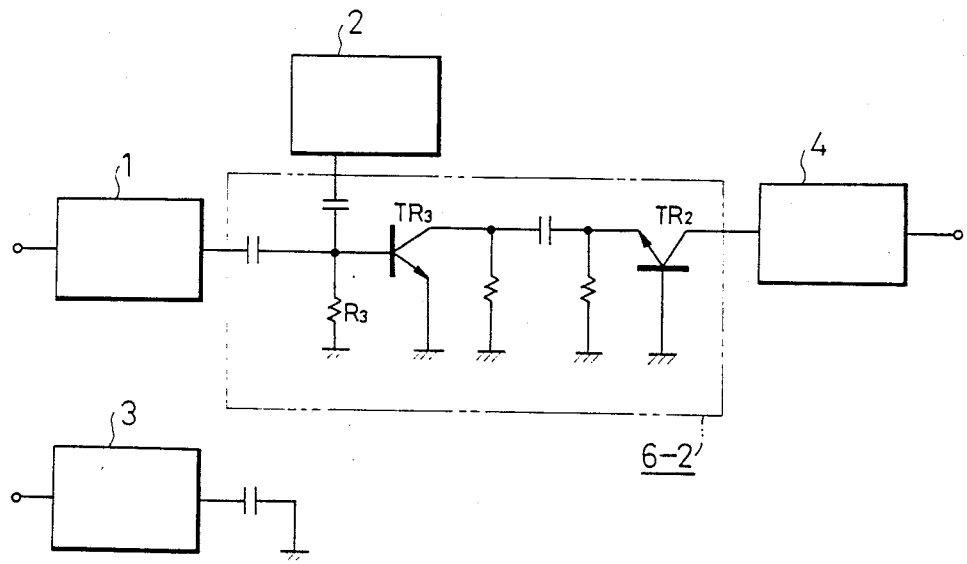

FIG. 3 is a circuit diagram showing an equivalent circuit of the circuit of FIG. 2. The power supply voltage Vcc is applied as the switching signal (d) through the resistor R$_1$ (FIG. 2) to allow the transistor TR$_3$ to operate with the emitter grounded. When the power supply voltage Vcc is applied as the switching signal (d), the diode D$_4$ is rendered conductive, and a voltage produced by dividing the power supply voltage Vcc with the resistors R$_1$, R$_2$ is applied as the bias voltage to the transistor TR$_3$. At the same time, the divided voltage is applied through the resistor R$_3$ to the base of the transistor TR$_3$ to forward-biasse the same or supply a bias current to the same. Since the capacitors C$_1$ and C$_2$ are pass capacitors which are short-circuited for high frequencies, they are omitted from the equivalent circuit of FIG. 3. As shown in FIG. 3, therefore, the IF signal supplied from the UHF circuit 3 to the mixer/amplifier circuit 6-2 is drained to ground, and hence the UHF circuit 3 does not produce any signal which would cause signal interference with respect to the VHF circuit 1 and also does not serve as any load with respect to the VHF circuit 1.

Figure 4:
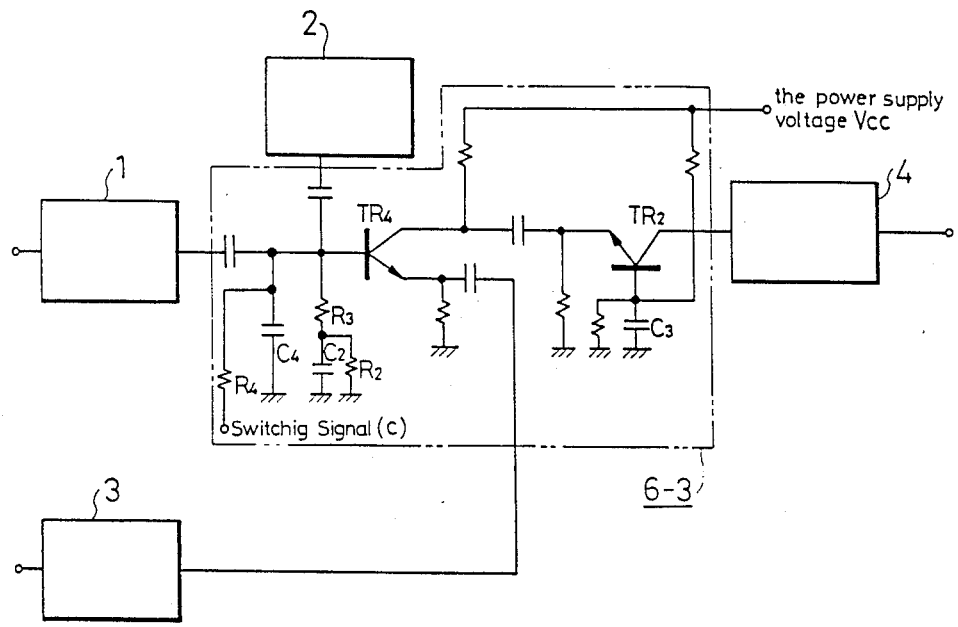

FIG. 4 shows a circuit arrangement employed when the power supply voltage Vcc is applied as the switching signal (c) for receiving a UHF signal. Since the the power supply voltage Vcc is only applied as the switching signal (c) and the switching signal (d) is of a zero voltage, the power supply voltage Vcc is applied, as shown in FIG. 1, through the resistor R$_4$, the diode D$_3$, and the resistor R$_3$ to the diode D$_4$ to reverse-bias the same. The diode D$_4$ is therefore rendered nonconductive and omitted from FIG. 4.

Figure 5:
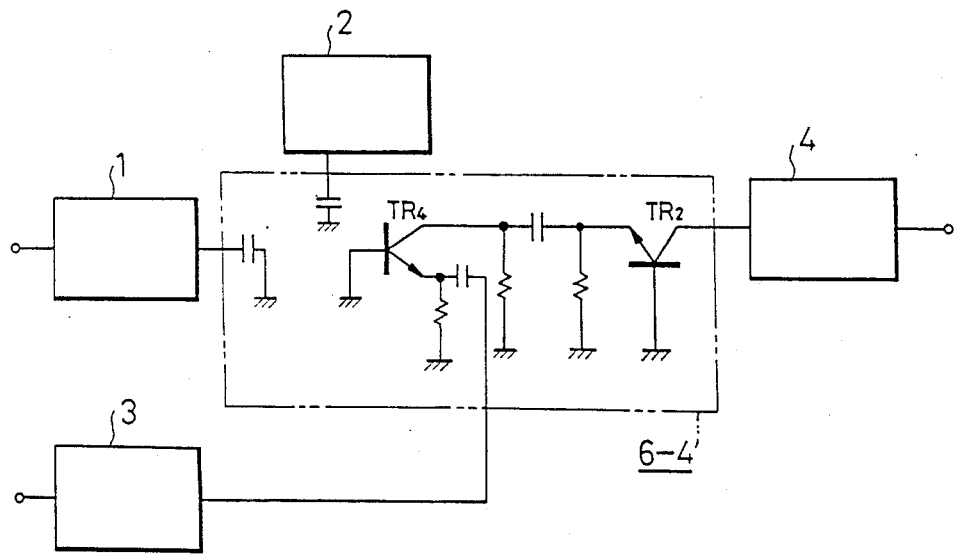

FIG. 5 is a circuit diagram showing an equivalent circuit of the circuit of FIG. 4. The power supply voltage Vcc is applied as the switching signal (c) through the resistor R$_4$ (FIG. 4) to allow the transistor TR$_4$ to operate with the base grounded. When the power supply voltage Vcc is applied as the switching signal (c), the diode D$_3$ is rendered conductive, and a voltage produced by dividing the power supply voltage Vcc with the resistor R$_4$ and the combined resistors R$_3$, R$_2$ is applied to the base of the transistor TR$_4$ to supply a forward bias current to the same. At the same time, a prescribed bias voltage is applied to the emitter of the transistor TR$_4$. Since the capacitors C$_2$ and C$_3$ are pass capacitors which are short-circuited for high frequencies, they are omitted from the equivalent circuit of FIG. 5. As shown in FIG. 5, therefore, the VHF signal supplied from the VHF circuit 1 to the mixer/amplifier circuit 6-4 is drained to ground, and hence the VHF circuit 1 does not produce any signal which would cause signal interference with respect to the UHF circuit 3 and also does not serve as any load with respect to the UHF circuit 3.

Figure 9:
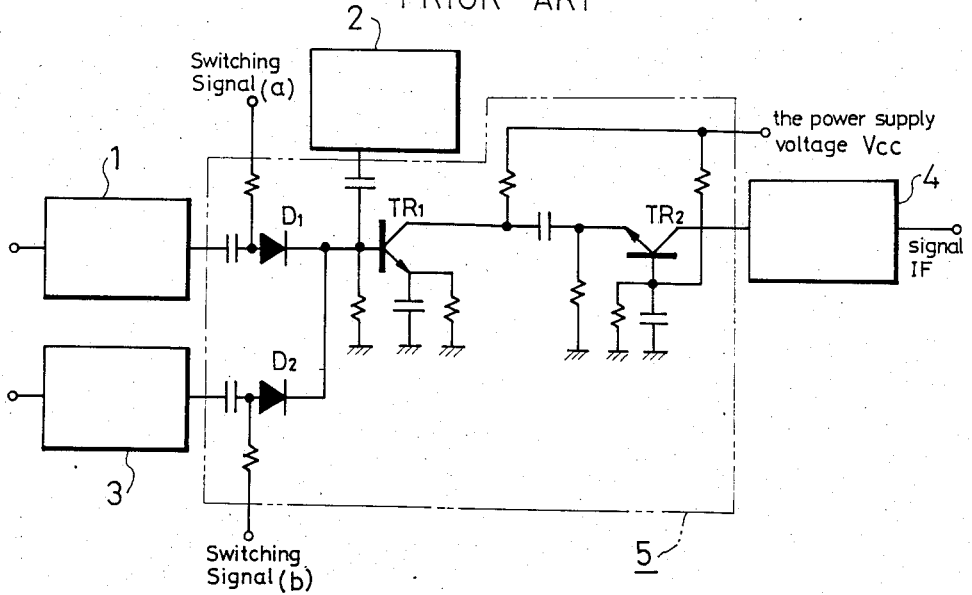
FIG. 9 is a circuit-digrams, partly in block form, showing a conventional mixer/amplifier.
Figure 10:
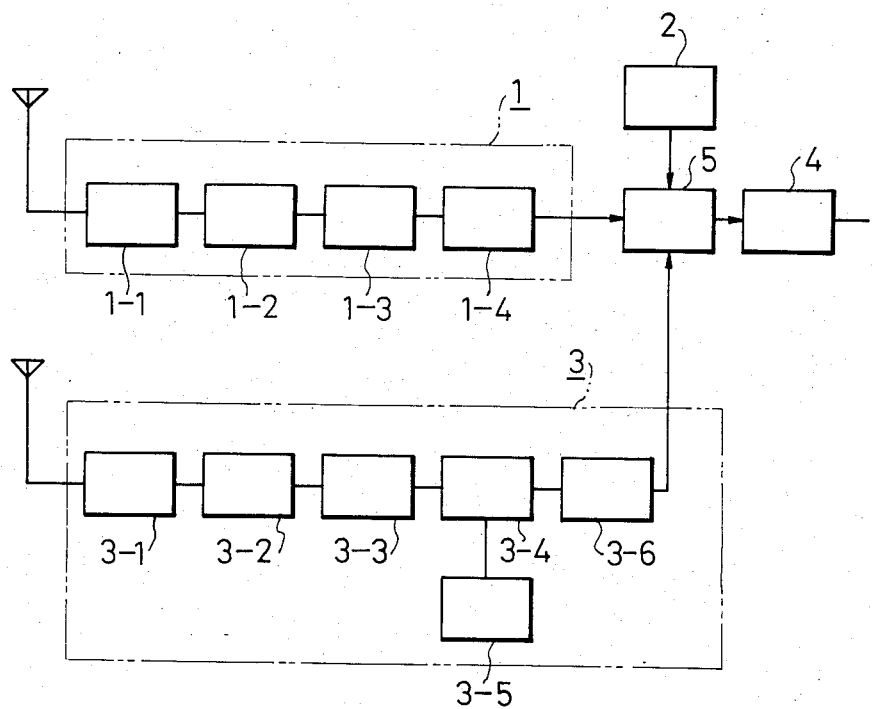
FIG. 10 is a block digram of a circuit arrangement including a mixer/amplifier circuit.

The difference between power gains G$_P$ of the conventional grounded-emitter transistor shown in FIG. 9 and the grounded-base transistor shown in FIGS. 4 and 5 at the time of receiving the UHF signal will be described.

Generally, the power gain G$_P$ of a transistor amplifier is expressed by h parameters as follows:

$$G_p \approx \frac{R_L}{h_i} \times h_f^2 \qquad (1)$$

where
$1 >> h_o R_L$,
$h_i >> (h_i h_o - h_r h_f) \times R_L$.
Therefore, the power gains of the grounded-emitter and grounded-base transistors are given respectively by:

$$G_{PE} = \frac{R_L}{h_{ie}} \times h_{fe}^2 \qquad (2)$$

$$G_{PB} = \frac{R_L}{h_{ib}} \times h_{fb}^2 \qquad (3)$$

The parameters $h_{fb}$, $h_{ib}$ are expressed by using $h_{fe}$, $h_{ie}$ as follows:

$$h_{ib} = \frac{h_{ie}}{1 + h_{fe}} \qquad (4)$$

$$h_{fb} = \frac{h_{fe}}{1 + h_{fe}} \qquad (5)$$

Hence, $$G_{PB} = \frac{R_L h_{fe}^2}{h_{ie}(1 + h_{fe})} \qquad (6)$$

Since normally $h_{fe} >> 1$, $$G_{PB} \approx \frac{R_L h_{fe}}{h_{ie}} \qquad (7)$$

Therefore, the power gain G$_{PB}$ is equal to 1/h$_{fe}$ of the power gain G$_{PE}$. It is understood that the grounded-base transistor has a smaller power gain than that of the grounded-emitter transistor. Based on this smaller power gain, it is possible to substantially equalize the level of the signal supplied from the UHF circuit 3 to the level of the signal supplied from the VHF circuit 1.

Figure 8:
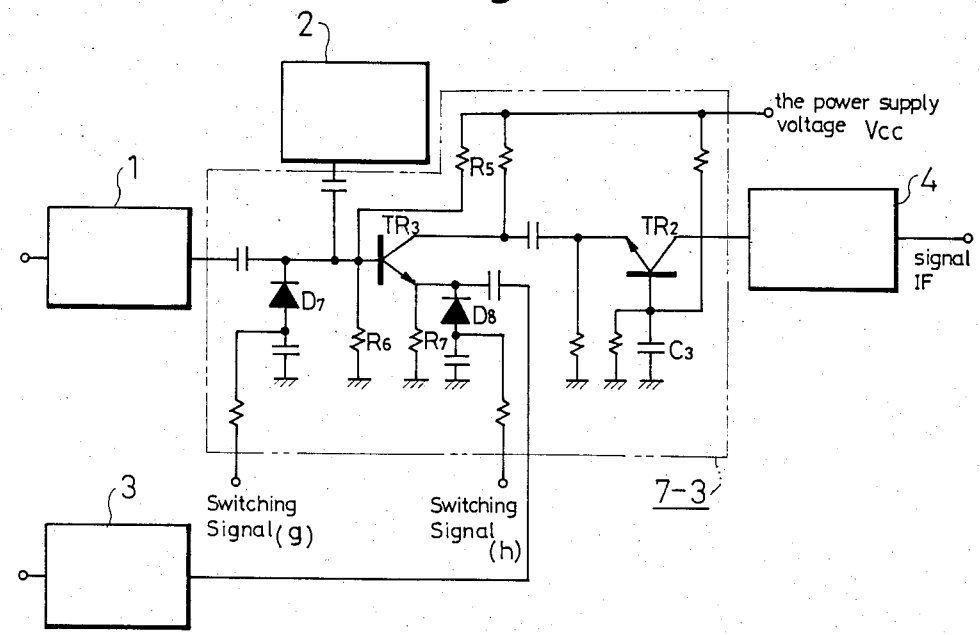

FIGS. 6 through 8 show mixer/amplifier circuits according to other embodiments of the present invention.

The mixer/amplifier of FIG. 6 is substantially the same as that of FIG. 1, except that a coil L is employed in place of the resistor $R_3$ for supplying a bias current to the base of the transistor $TR_3$ when the power supply voltage Vcc is applied as the switching signal (d) and for applying a reverse-biasing voltage to hold the diode $D_4$ nonconductive when the power supply voltage Vcc is applied as the switching signal (c). With the coil L, it is possible to improve the frequency characteristics by introducing so-called peaking only when a VHF signal is received, for example. A choke may be used for the coil L.

FIG. 7 shows a circuit arrangement in which when the power supply voltage Vcc is applied as a switching signal (e) or a switching signal (f), the diode $D_5$ or $D_6$ is rendered nonconductive or reverse-biased for switching between the signals from the VHF circuit 1 and the UHF circuit 3. When the power supply voltage Vcc is applied as the switching signal (e) for receiving the VHF signal, the diode $D_5$ is rendered nonconductive to cause the transistor $TR_3$ to operate as a grounded-emitter transistor. A voltage produced by dividing the power supply voltage Vcc with the resistors $R_5$, $R_6$ is applied to the base of the transistor $TR_3$ to supply the same with a forward bias current. The bias voltage for the transistor $TR_3$ is of a value dependent on the resistor $R_7$, the voltage drop across the diode $D_6$ as forward-biased, and the resistor $R_2$. When the power supply voltage Vcc is applied as the switching signal (f) for receiving the UHF signal, the diode $D_6$ is rendered nonconductive to cause the transistor $TR_3$ to operate as a grounded-base transistor. A voltage produced by dividing the power supply voltage Vcc with the resistor $R_5$ and the parallel-connected resistors $R_6$, $R_8$ is applied to the base of the transistor $TR_3$ to supply the same with a forward bias current. The bias voltage for the transistor $TR_3$ is of a value dependent on the resistor $R_7$.

FIG. 8 shows a circuit arrangement in which the power supply voltage Vcc is applied as a switching signal (g) to the diode $D_7$ for receiving the UHF signal or as a switching signal (h) to the diode $D_8$ for receiving the VHF signal, to increase the emitter voltage or base voltage of the transistor $TR_3$. The bias current for the transistor $TR_3$ is supplied by applying a voltage obtained by dividing the power supply voltage Vcc with the resistors $R_5$, $R_6$. The bias voltage for the transistor $TR_3$ is produced by the resistor $R_7$.

With the arrangement of the present invention, as described above, signals of different levels in different frequency bands such as VHF and UHF bands can be issued as the same IF signals of reduced distortion at a given level by switching between grounded-base and grounded-emitter transistors at the same time that the frequency bands are changed. More specifically, the grounded-emitter transistor having a larger power gain is employed for frequency-converting the VHF signal from the VHF circuit, and the grounded-base transistor having a smaller power gain is employed for amplifying an IF signal of larger level which has been converted from the UHF signal by the UHF circuit. Therefore, signals of reduced distortion can be produced at a fixed level by the simple circuit arrangement. As both input signals are applied through separate base and emitter terminals, the input signals are not mixed with each other.

Although certain preferred embodiments have been shown and described, it should be understood that many changes and modifications may be made therein without departing from the scope of the appended claims.

What is claimed is:

1. A mixer/amplifier circuit for selectively mixing a first input signal with a local oscillator signal or amplifying a second input signal, said mixer/amplifier circuit comprising:
    (a) a transistor;
    (b) a first circuit arrangement responsive to a first switching signal for enabling said transistor to operate as a grounded-base transistor to amplify the second input signal supplied to the emitter thereof; and
    (c) a second circuit arrangement responsive to a second switching signal for enabling said transistor to operate as a grounded-emitter transistor to mix the first input signal supplied to the base thereof with the local oscillator.

2. A mixer/amplifier according to claim 1, wherein said first circuit arrangement comprises a diode connected to the base of said transistor.

3. A mixer/amplifier according to claim 1, wherein said second circuit arrangement comprises a diode connected to the emitter of said transistor.

* * * * *